(12) United States Patent
Sayir et al.

(10) Patent No.: US 7,220,485 B2
(45) Date of Patent: May 22, 2007

(54) BULK HIGH THERMAL CONDUCTIVITY FEEDSTOCK AND METHOD OF MAKING THEREOF

(75) Inventors: Haluk Sayir, Bay Village, OH (US); John Thomas Mariner, Avon Lake, OH (US)

(73) Assignee: Momentive Performance Materials Inc., Wilton, CT (US)

( * ) Notice: Subject to any disclaimer, the term of this patent is extended or adjusted under 35 U.S.C. 154(b) by 403 days.

(21) Appl. No.: 10/761,567

(22) Filed: Jan. 21, 2004

(65) Prior Publication Data
US 2005/0064230 A1    Mar. 24, 2005

Related U.S. Application Data

(60) Provisional application No. 60/504,537, filed on Sep. 19, 2003.

(51) Int. Cl.
*B32B 9/00* (2006.01)
(52) U.S. Cl. ...................................................... 428/408
(58) Field of Classification Search ................ 428/408; 423/445 R; 427/448
See application file for complete search history.

(56) References Cited

U.S. PATENT DOCUMENTS

| | | | |
|---|---|---|---|
| 3,404,061 A | 10/1968 | Shane et al. | |
| 3,673,051 A | 6/1972 | Clark et al. | 161/166 |
| 4,054,708 A | 10/1977 | Robba et al. | 428/220 |
| 5,296,310 A | 3/1994 | Kibler et al. | 428/614 |
| 5,761,256 A | 6/1998 | Inoue et al. | 378/84 |
| 5,863,467 A * | 1/1999 | Mariner et al. | 252/511 |
| 5,958,572 A | 9/1999 | Schmidt et al. | |
| 6,060,166 A * | 5/2000 | Hoover et al. | 428/408 |
| 6,075,701 A | 6/2000 | Ali et al. | |
| 6,131,651 A | 10/2000 | Richey et al. | |
| 6,171,701 B1 | 1/2001 | Moore | 428/408 |
| 6,215,661 B1 | 4/2001 | Messenger et al. | 361/704 |
| 6,407,922 B1 | 6/2002 | Eckblad et al. | |
| 6,579,747 B1 | 6/2003 | Zuo | 438/122 |
| 2002/0021997 A1* | 2/2002 | Taomoto et al. | 423/448 |
| 2003/0116312 A1 | 6/2003 | Krassowski et al. | |

FOREIGN PATENT DOCUMENTS

EP    432944    6/1991

* cited by examiner

*Primary Examiner*—Jennifer C. McNeil
*Assistant Examiner*—Daniel Miller
(74) *Attorney, Agent, or Firm*—Dominick G. Vicari

(57) ABSTRACT

The invention relates to a feedstock material for use in making heat spreaders, comprising a sheet of annealed pyrolytic graphite having a thermal conductivity of greater than 1000 watts/m-K, a size in any dimension of at least 5 cm and a thickness of at least 0.2 mm. In one embodiment, the feedstock is made by hot-pressing a stack of alternate layers of pyrolytic graphite sheets with flat graphite dies for a finished sheet of annealed pyrolytic graphite comprising a plurality of layers being parallel to each other of at least 0.075 degrees per mm of thickness. In another embodiment, the finished sheet of annealed pyrolytic graphite is made by graphitizing a stack of films comprising a high-carbon polymer.

9 Claims, 1 Drawing Sheet

BULK HIGH THERMAL CONDUCTIVITY FEEDSTOCK AND METHOD OF MAKING THEREOF

CROSS-REFERENCE TO RELATED APPLICATIONS

This application claims priority on U.S. Provisional Application Ser. No. 60/504,537, filed on Sep. 19, 2003.

FIELD OF THE INVENTION

The present invention relates to a bulk sheet of a thermally and electrically conductive composite of thermally treated pyrolytic graphite for use in one application as a heat spreader, e.g., transferring heat away from a heat source, and method for forming a bulk sheet of thermally treated pyrolytic graphite.

BACKGROUND OF THE INVENTION

Electronic and/or integrated circuit ("IC") devices, e.g., microprocessors, memory devices, and the like, are becoming smaller while heat dissipation requirements are increasing. In order to dissipate the heat generated by these devices, heat spreaders and/or heat sinks are used.

Several materials and designs have been disclosed for the management and removal of heat from electronic devices. U.S. Pat. No. 5,296,310 discloses a hybrid structural device of a high thermal conductivity material sandwiched between a pair of face sheets comprising a metal or matrix-reinforced metal. The core material can be a highly ordered pyrolytic graphite, compression annealed pyrolytic graphite (CAPG), synthetic diamond, composites using these materials, or the like. U.S. Pat. No. 6,215,661 discloses a heat spreader comprising an L-shaped plate of thermal pyrolytic graphite encapsulated in aluminum. U.S. Pat. No. 5,958,572 discloses a heat spreading substrate comprising an insert of thermal pyrolytic graphite ("TPG"), a diamond-like-carbon, and the like material having a plurality of vias formed within, to optimize heat flow transfer through the plurality of vias.

Some forms of pyrolytic graphite in the prior art, particularly those made by chemical vapor deposition processes, suffer from non-uniform thickness, which is due to variations in crystallographic plane thickness. Adjacent crystallographic layers are substantially parallel, but variations on the crystallographic scale accumulate over macroscopic thicknesses. For example, at 1 mm, the natural layer plane surfaces are not parallel. Thermal pyrolytic graphite "tiles" having the requisite thermal conductivity properties are available in the art for the making of heat spreader. However, they have relatively small dimensions, e.g., 2 cm width and 0.1 cm thick, for making relatively small heat spreaders. U.S. Pat. No. 6,407,902 offers a solution around the small-sized pyrolytic graphite tiles with heat spreaders comprising thermal pyrolytic graphite flakes incorporated in a matrix material. The composite graphite material can be machined into spreaders of desired dimensions, obviating the use of multiple fixed small-sized graphite tiles in the art.

There exists a need for a high thermal conductivity material of improved quality and size for use in devices for removing heat from electronic and IC equipment, i.e., a material suitable as a feedstock for making heat spreaders, heat inks, and the like. There is also the need for a process to make such high thermal conductivity feedstock.

BRIEF SUMMARY OF THE INVENTION

In one aspect of the present invention, a feedstock material for use in making heat spreaders is disclosed, the feedstock material comprising a sheet of annealed pyrolytic graphite having a thermal conductivity of greater than 1000 watts/m-K, a size in any dimension of at least 5 cm, a thickness of at least 0.2 mm, comprising a plurality of graphite planes each having a flatness of less than about 0.075 degrees per mm of thickness.

The invention further relates to a method for making a feedstock material comprising a sheet of annealed pyrolytic graphite having a thermal conductivity of greater than 1000 watts/m-K, a size in any dimension of at least 5 cm, a thickness of at least 0.2 mm, comprising a plurality of graphite planes each having a flatness of less than about 0.075 degrees per mm of thickness.

DETAILED DESCRIPTION OF THE INVENTION

Figure 1:
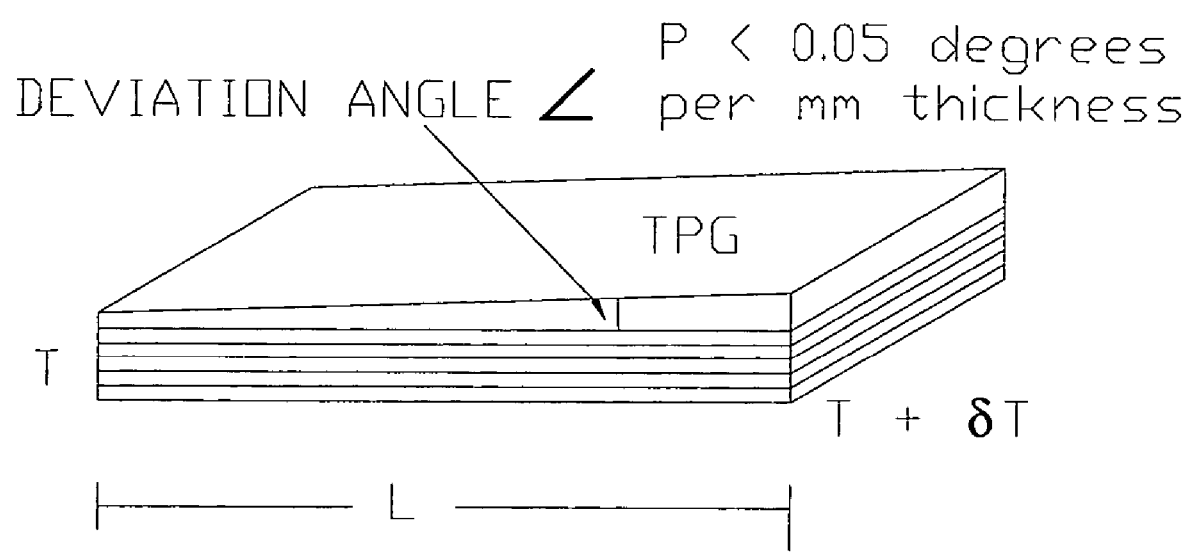
FIG. 1 is a perspective view showing a sheet of annealed pyrolytic graphite having a thickness T, a side having a length of L, and a deviation angle P.

Applicants have developed a novel feedstock material for use in making heat management/heat spreader applications. As used herein, heat spreaders are used interchangeably with heat sinks, heat pipes, etc., referring, to a thermal management device or a heat transfer device comprising a material of high thermal conductivity for dissipating or removing heat from IC circuits, electronic devices, and the like.

As known in the art, mass manufactured TPG layer parallelism worsens as the thickness of the feedstock material increases. The thickness of TPG layer can be expressed as the deviation angle P per thickness T at a distance "L" of greater than 25 mm, defined as follows and also as illustrated in FIG. 1:

$$P = \frac{1}{T}\tan^{-1}\left(\frac{\delta T}{L}\right),$$

wherein $\delta T$ is the difference in thickness over a distance L.

Also as known in the art, graphite may be characterized as laminated structures of carbon atoms having two principal axes, one is the "c" axis which is generally identified as the axis or direction perpendicular to the carbon layers; the other axis is the "a" axis or the direction parallel to the graphite layers and transverse to the c axis.

In one embodiment of the invention, the novel feedstock material comprises a sheet of annealed pyrolytic graphite having a thermal conductivity of at least 1000 watts/m-K, with a size in any dimension (i.e., width, length, circumference, etc.) of at least 5 cm, and a thickness of at least 0.2 mm, with the graphite planes or layers being parallel to one another and having a flatness as expressed in deviation angle P of less than 0.075 degrees per mm thickness (in the c direction). In a second embodiment of the invention, the deviation angle P is less than 0.07 degrees per mm thickness. In a third embodiment, the deviation angle P is less than 0.05 degrees per mm thickness.

Manufacture of Quality Feedstock Annealed Pyrolytic Graphite. Pyrolytic graphite generally is made by passing a carbonaceous gas at low pressure over a substrate held at a high temperature, wherein pyrolysis occurs and the pyrolytic graphite is vapor-deposited on the exposed mandrel surface.

In one embodiment of the invention utilizing a chemical vapor deposition (CVD) process, a hydrocarbon gas such as methane, natural gas, acetylene, etc., is introduced into a heated furnace at a temperature of about 1300-2500° C. and a pressure of about 0.5-500 millimeters of mercury. The hydrocarbon gas would thermally decompose at the surface of a substrate of a suitable composition such as graphite (natural or synthetic), forming pyrolytic graphite in the form of a sheet or board with the use of a flat substrate.

In one embodiment of the CVD process, a small amount of a volatile alloy metal source ($BCl_3$, $HfCl_4$, $BF_3$, or other halides of the refractory metals), is fed into the furnace along with the hydrocarbon gas to decrease the stress levels and increase the thickness of the deposited TPG layer on the substrate. In yet another embodiment, a diluent gas that is inert to the reactant, the pyrolysis product and the substrate is incorporated in the hydrocarbon feed source. The diluent gas can be typically helium, neon, argon, krypton, xenon, radon, hydrogen, nitrogen, and the like. The introduction of the diluent gas helps in controlling the rate of carbon deposition and thus the resulting thickness of the pyrolytic graphite sheet or board.

The pyrolytic graphite sheet is separated from the base substrate, and further subjected to a thermal annealing process. However, in the process of cooling to room temperature, thermal stresses are introduced into the material thus creating bow (wrinkles) condition in the pyrolytic graphite sheet of up to 1 mm per 100 mm of length of sheet.

In the annealing step, the pyrolytic graphite is heated at a temperature of above 2900° C. for about 10 to 30 minutes depending oil the thickness and bulk of the product being annealed, thus forming a highly oriented pyrolytic graphite ("HOPG") or sometimes called thermal pyrolytic graphite ("TPG"). In this process, crystallographic changes take place resulting in an improvement in layer plane orientation, a decrease in thickness normal to the layer planes (decrease in the c direction), and an increase in length and width dimensions (increase in the a direction). The improved orientation along with an increase in crystallization size results in an excellent thermal conductivity of least 1000 watts/m-K in the finished material.

Applicants have found that hot-pressing the layers in the annealing process surprisingly "cures" or treats the bow condition and thus allowing TPG feedstock of desired "quality" to be made, e.g. large-sized TPG sheets of sufficient thermal conductivity and parallelism of the graphite layers for use in thermal management applications. The hot pressing may be done using processes and apparatuses known in the art, e.g., using dies, rollers, and the like.

In one embodiment of the invention, the pyrolytic graphite is heat-treated within the above-mentioned temperature range and hot pressed against dies to remove uneven bumps or wrinkles generated on the carbonaceous sheets or substrates in the chemical vapor deposition process. The dies may be in the form of isotropic graphite plates having a size corresponding to a full size or partial size of the graphite sheet, e.g., covering at least 75% of the surface area of the graphite sheet. In one embodiment of this processing step, the PG sheets or boards are alternately stacked with the flat graphite plates, with a weight of a graphite block being placed on top of the stack to evenly distribute the weight onto the graphite boards.

In yet another embodiment of the invention, the carbon feedstock is used in the form of a high-carbon polymer (instead of a hydrocarbon gas) for making the pyrolytic graphite sheets or boards. In one example of this process, sheets (or films) of high-carbon polymers are stacked together and hot pressed in the direction normal to the sheet at a sufficient temperature and for a sufficient amount of time for the polymeric material to carbonize and become graphitic. In one example, a stack of polyimide films (examples include Kapton® from E. I. duPont de Nemours and Upilex® from Uniglobe-Kisco, Inc.) of a size of at least 5 mm in one dimension, and a thickness of <50 microns is heated to a temperature of about 2820 to 3000° C. for complete graphitization of the films, forming an annealed pyrolytic graphite sheet having graphite planes parallel to each other, i.e., having a flatness or deviation angle of less than or equal to about 0.075 degrees per mm of thickness.

In one embodiment of the invention and as taught in European Patent Application No. EP 432944 A1, the graphitized pyrolytic graphite or TPG formed is subsequently treated with an intercalating agent which will facilitates the exfoliation or separation of the layers of graphitized pyrolytic graphite in the c axis. After intercalation, i.e., being treated with the intercalating agent, the treated pyrolytic graphite may be washed or purged free of excess intercalating agent.

Examples of intercalating agent include organic and inorganic acids such as nitric acid, sulfuric acid, perhalo acid and mixtures thereof, 7,7,8-8-tetracyanoquinomethane (TCNQ), tegracyanoethylene (TCNE), 1,2,4,5-tetracyanobenzene (TCBN), and the like; bromine and ferric chloride; nitric acid and chlorate of potash.

Applications of the TPG Feedstock Material of the Invention: In one example of the invention, the finished product from the hot-pressing/annealing operation is a bulk TPG stock having a thermal conductivity of at least 1000 w/m-K, a size of at least 5 cm in one dimension, e.g., a sheet of 5 cm wide, 10 cm long, and 0.8 cm thick, comprising multiple layers (similar to shale or mica) of graphite with little or no bow (uneven-ness in the surface of the layers) with the layers being parallel to one another, defined as having a flatness or deviation angle of less than about 0.075 degrees per mm of thickness.

In the example above, the graphite layers or the bulk TPG stock can be subsequently cleaved into layers of desired thickness, e.g., 8 layers of 0.1 cm thick and machined into individual tiles for heat spreaders application. In one operation, the 5 cm by 10 cm by 0.8 cm bulk TPG stock of the invention can be made into 64 square tiles of 2.4 cm by 0.1 cm thick.

In a comparable example, a prior art feedstock TPG sheet is used in making TPG tiles of the same dimensions. The bulk stock is a typical commercially available sheet of 0.1 mm of curvature in the layer planes over a thickness of 0.8 cm. The sheet is also cleaved as in the above example to make finished tiles of 0.1 cm thick. However, in order to make a flat tile, each cleaved piece must have 0.1 mm excess material per side to allow for machining, i.e., each cleaved piece must be 1.2 mm thick hence only 6 tie layers of a flat 0.1 cm thick can be made from the TPG stock of the prior art. The process results in a minimum of 25% material waste (6 parts as opposed to 8 parts using the TPG feedstock of the present invention) as well as loss time required in the machining process to obtain flat tiles of 0.1 cm thick.

EXAMPLES

Examples are provided herein to illustrate the invention but are not intended to limit the scope of the invention.

In the examples, TPG sheets prepared by a CVD process is thermally annealed at a temperature of about 2900° C.-3200° C. for about 10 minutes to up to 2 hours, wherein the sheets are hot pressed by isotropic graphite plates while being thermally annealed for the resulting bulk TPG sheet of the following Examples.

Example 1

In this example, thickness and deviation of the thickness is measured at about every 76 mm apart along the length of the 356 mm long TPG slab. The deviation angle is calculated per formula. The P value found to be less than 0.075 degrees per mm thickness, with the results are as follows:

| Distance mm | L | 25.4 | 101.6 | 177.8 | 254 | 356 |
|---|---|---|---|---|---|---|
| Thickness variation mm | dT | 0.05 | 0.127 | 0.228 | 0.279 | 0.355 |
| Thickness mm | T | 15.21 | 15.26 | 15.26 | 15.29 | 15.39 |
| Degrees/mm thickness | P | 0.007 | 0.005 | 0.005 | 0.004 | 0.004 |

Example 2

In the second example, thickness and deviation of the thickness is measured at about every 76 mm apart along the length of a 380 mm long TPG slab. The deviation angle is calculated per formula. The P value is also found to be less than 0.075 degrees per mm thickness:

| Distance mm | L | 25.4 | 101.6 | 177.6 | 254 | 356 |
|---|---|---|---|---|---|---|
| Thickness variation mm | dT | 0.152 | 0.127 | 0.279 | 0.533 | 1.066 |
| Thickness mm | T | 10.71 | 10.74 | 10.76 | 10.81 | 11.02 |
| Degrees/mm thickness | P | 0.032 | 0.007 | 0.008 | 0.011 | 0.016 |

Example 3

In the third example, thickness and deviation of the thickness is measured at about every 76 mm apart along the length of a 260 mm long TPG slab. The deviation angle is calculated per formula. Again, the P value is found to be less than 0.075 degrees per mm thickness:

| Distance mm | L | 25.4 | 101.6 | 177.6 | 254 |
|---|---|---|---|---|---|
| Thickness variation mm | dT | 0.177 | 0.12 | 0.076 | 0.279 |
| Thickness mm | T | 13.46 | 13.58 | 13.66 | 13.7 |
| Degrees/mm thickness | P | 0.007 | 0.003 | 0.001 | 0.005 |

While the invention has been described with reference to a preferred embodiment, those skilled in the art will understand that various changes may be made and equivalents may be substituted for elements thereof without departing from the scope of the invention. It is intended that the invention not be limited to the particular embodiment disclosed as the best mode for carrying out this invention, but that the invention will include all embodiments falling within the scope of the appended claims.

All citations referred herein are expressly incorporated herein by reference.

We claim:

1. An annealed thermal pyrolytic graphite ("TPG") feedstock material comprising
    a board of annealed pyrolytic graphite having a thermal conductivity of greater than 1000 watts/m-K, a size in any dimension of at least 5 cm, a thickness of at least 0.2 mm, wherein
    said board consists essentially of a plurality of flat graphite layers being parallel to each other;
    said board has a flatness with a deviation angle of less than 0.075 degrees per mm of thickness; and
    said annealing is at a temperature of above 2900° C.

2. The annealed TPG material of claim 1, having length and width dimensions of at least 5 cm respectively.

3. The annealed TPG material of claim 1, having a thickness of at least 0.5 mm.

4. The annealed TPG material of claim 1, in the form of a graphitized board of polyimide.

5. The annealed TPG material of claim 4, wherein said graphitized board of polyimide comprises a plurality of polyimide films having a thickness of less than 50 microns graphitized at a temperature of at least about 2800° C.

6. The annealed TPG material of claim 1, in the form of a hot pressed board of pyrolytic graphite.

7. The annealed TPG material of claim 6, wherein said board of pyrolytic graphite is hot-pressed by heating a stack of alternate layers of graphite plates and pyrolytic graphite layers at sufficient temperature and pressure for a sufficient period of time to convert said pyrolytic graphite into highly oriented pyrolytic graphite.

8. The annealed TPG material of claim 7, wherein said board of pyrolytic graphite is hot-pressed by using a plurality of graphite plates as dies.

9. An article comprising the annealed TPG feedstock material of claim 1.

* * * * *